(12) United States Patent
Kim et al.

(10) Patent No.: US 9,444,025 B2
(45) Date of Patent: Sep. 13, 2016

(54) METHOD OF MANUFACTURING THERMOELECTRIC MATERIAL AND THERMOELECTRIC MATERIAL PREPARED BY THE METHOD AND THERMOELECTRIC GENERATOR

(71) Applicant: Industry-Academic Cooperation Foundation, Yonsei University, Seoul (KR)

(72) Inventors: Woochul Kim, Seoul (KR); Hongchao Wang, Seoul (KR); Jun Phil Hwang, Seoul (KR); Chanyoung Kang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 100 days.

(21) Appl. No.: 14/300,567

(22) Filed: Jun. 10, 2014

(65) Prior Publication Data

US 2014/0361212 A1    Dec. 11, 2014

(30) Foreign Application Priority Data

Jun. 10, 2013 (KR) .......................... 10-2013-0065618
Jun. 5, 2014  (KR) .......................... 10-2014-0068559

(51) Int. Cl.
| | | |
|---|---|---|
| *H01L 35/16* | (2006.01) | |
| *H01L 35/34* | (2006.01) | |
| *C01B 19/00* | (2006.01) | |

(52) U.S. Cl.
CPC ............ *H01L 35/16* (2013.01); *C01B 19/007* (2013.01); *H01L 35/34* (2013.01); *C01P 2002/72* (2013.01); *C01P 2004/03* (2013.01); *C01P 2004/04* (2013.01); *C01P 2004/61* (2013.01); *C01P 2004/82* (2013.01); *C01P 2006/32* (2013.01); *C01P 2006/40* (2013.01); *C01P 2006/90* (2013.01)

(58) Field of Classification Search
CPC ............................. C01B 19/002; H01L 35/16
See application file for complete search history.

(56) References Cited

U.S. PATENT DOCUMENTS

| | | | | |
|---|---|---|---|---|
| 3,268,330 A | * | 8/1966 | Kendall, Jr. ............ | H01L 35/16 252/62.3 ZT |
| 2012/0138870 A1 | * | 6/2012 | Snyder .................... | H01L 35/16 252/513 |
| 2014/0027681 A1 | * | 1/2014 | Snyder .................... | H01L 35/16 252/519.14 |

FOREIGN PATENT DOCUMENTS

| | | |
|---|---|---|
| KR | 1020010007507 A | 1/2001 |
| KR | 1020060073017 A | 6/2006 |
| KR | 100805726 B1 | 2/2008 |
| KR | 2008-0104378 A | 12/2008 |
| KR | 20110079490 A | 7/2011 |
| KR | 20120124466 A | 11/2012 |
| KR | 101417968 B1 | 7/2014 |

OTHER PUBLICATIONS

Wang, et al., "Transmission electron microscopy study of Pb-depleted disks in PbTe-based alloys", J. Mater. Res., vol. 26, No. 7, pp. 912-916 (Apr. 14, 2011).
Yamini, et al., "Rational design of p-type thermoelectric PbTe: temperature dependent sodium solubility", Journal of Materials Chemistry A, 1, pp. 8725-8730 (Jun. 21, 2013).

\* cited by examiner

*Primary Examiner* — Carol M Koslow
(74) *Attorney, Agent, or Firm* — Carter, DeLuca, Farrell & Schmidt, LLP

(57) ABSTRACT

Provided is a method of manufacturing a Pb—Te based thermoelectric material, the method comprising: forming a Pb—Te based by mixture mixing element lead, element tellurium and a dopant; melting and then quenching the mixture; and obtaining a thermoelectric sintered body by hot-pressing a molded body obtained after the quenching.

15 Claims, 10 Drawing Sheets

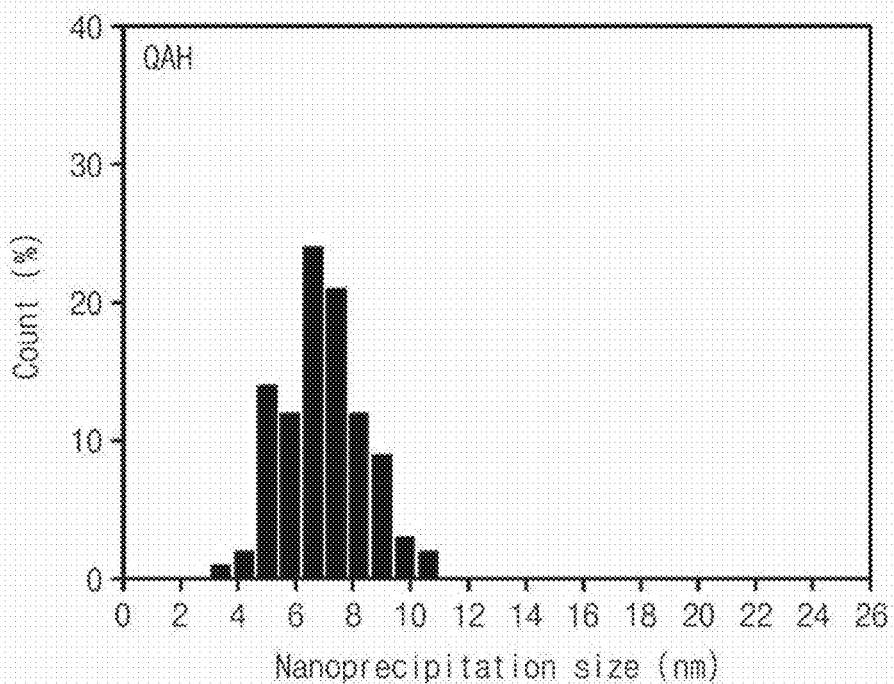

METHOD OF MANUFACTURING THERMOELECTRIC MATERIAL AND THERMOELECTRIC MATERIAL PREPARED BY THE METHOD AND THERMOELECTRIC GENERATOR

CROSS-REFERENCE TO RELATED APPLICATIONS

This U.S. non-provisional patent application claims priority under 35 U.S.C. §119 of Korean Patent Application No. 10-2013-0065618, filed on Jun. 10, 2013 and 10-2014-0068559, filed on Jun. 5, 2014, the entire contents of which are hereby incorporated by reference.

BACKGROUND OF THE INVENTION

The present invention disclosed herein relates to a method of manufacturing a thermoelectric material, a thermoelectric material prepared by the method, and a thermoelectric generator using the same.

Due to great demands for electricity all over the world, sustainable energy technologies have attracted great attention. However, renewable energy sources, such as solar power, wind power or the like are in charge of only an extremely small proportion of total electricity generation due to relatively high costs. In this regard, heat energy has been evaluated as having a low cost, sustainable and potential energy source. However, a significant proportion of the energy is wasted in the form of heat. Heating processes in households, exhausts in vehicles, and industrial processes all generate a significant amount of waste heat. Due to such a large potential, there is a lot of interest in a cost-effective technology for generating electricity from the waste heat.

In relation to this, since a thermoelectric material is capable of directly converting heat into electricity, the thermoelectric material has attracted much more attention. The thermoelectric material is a metal or ceramic material having a function capable of directly converting heat to electricity, or electricity into heat, and applications of the thermoelectric material to a thermoelectric generation or thermoelectric cooling using waste heat generated by waste incineration, waste heat generated by a turbine generation, exhaust gas heat of vehicle, waste heat generated by combustion of city gas, various industrial waste heat and the like have attracted attention. The thermoelectric generation using such thermoelectric materials has a characteristic in that power generation is possible without a separate operation unit if only a difference in temperature is given, and has advantages in which a structure thereof is simple and a breakdown thereof is rare, so that maintenance and management are easy, a noise is negligible, and a selection range of a used heat source is wide. Also, the thermoelectric cooling has characteristics and advantages in that a breakdown thereof is rare, a noise is negligible, selective cooling for micro portions is possible, and thermal response sensitivity is high, so that a precise heat control is possible, and a compressor or refrigerant is not necessary.

Meanwhile, efficiency of the thermoelectric material may be evaluated as a performance index $ZT=S^2T/\rho\kappa$, where S is a Seebeck coefficient, $\rho$ is electric resistance, $\kappa$ is heat conductivity, and T is absolute temperature. That is, as the more the performance index, the higher the conversion efficiency is.

Since an amount of electric energy in thermoelectric materials increases in proportional to the performance index, a thermoelectric material having a high performance index represents an excellent property. Therefore, for an application of a material to the thermoelectric material from the above formula, there is required a thermoelectric material having high Seebeck index, high electrical conductivity, and low thermal conductivity.

While a PbTe-based alloy that is one of typical thermoelectric materials has been studied for a long time, the performance index stays close to about 1 for decades. Recently, a new physical principle capable of improving the thermoelectric performance has been proposed, but the improvement of the performance index is limited.

SUMMARY OF THE INVENTION

The present invention provides a method of manufacturing a thermoelectric material and a thermoelectric material capable of reducing process time and costs.

The present invention also provides a method of manufacturing a thermoelectric material and a thermoelectric material capable of improving a performance index.

The object of the present invention is not limited to the aforesaid, but other objects not described herein will be clearly understood by those skilled in the art from descriptions below.

Embodiments of the present invention provide methods of manufacturing a Pb—Te based thermoelectric material, the method comprising: forming a Pb—Te based mixture by mixing element lead, element tellurium and a dopant; melting and then quenching the mixture; and obtaining a thermoelectric sintered body by hot-pressing a molded body obtained after the quenching.

In some embodiments, the dopant may be at least one of sodium (Na), potassium (K), and silver (Ag).

In other embodiments, the forming of the mixture may comprise mixing element lead, element tellurium and the dopant so that a composition ratio of the dopant is 2 atom %.

In still other embodiments, three quarters of the dopant may be precipitated within a crystal grain of the Pb—Te based thermoelectric material.

In even other embodiments, 1.5 atom % of the dopant may be precipitated in a size of about 2 nm to about 4 nm within the crystal grain of the Pb—Te based thermoelectric material.

In yet other embodiments, after quenching the mixture, the hot-pressing may be performed without performing of an annealing process.

In further embodiments, the method may further comprise performing a soaking process prior to the melting of the mixture.

In still further embodiments, the thermoelectric sintered body may have a thermoelectric performance index of at least 2.0 or more in a middle temperature region of about 700 K to about 800 K.

In even further embodiments, the obtaining of the thermoelectric sintered body may comprise pulverizing the molded body in the form of a powder and hot-pressing the pulverized powder.

In yet further embodiments, the dopant may comprise sodium (Na), and the obtaining of the thermoelectric sintered body may include precipitating sodium.

In much further embodiments, the sodium in the precipitating of sodium (Na) may be precipitated in at least one selected from NaTe and $Na_2Te$.

In still much further embodiments, the NaTe and the $Na_2Te$ may be precipitated in sizes of about 2 nm to 4 about nm.

In yet much further embodiments, the thermoelectric sintered body may comprise a plurality of crystal grains having a average size of about 3 µm to about 4 µm.

In other embodiments of the present invention, Pb—Te thermoelectric materials including a Pb—X—Te in which a dopant X is doped, the Pb—Te materials including: a plurality of crystal grains; and a precipitate precipitated in a size of about 2 nm to about 4 nm within the crystal grains, and containing the dopant therein.

In some embodiment, the plurality of crystal grains may have an average particle size of about 3 µm to about 4 µm.

In other embodiments, the Pb—Te based thermoelectric material may have a composition of $Pb_{0.98-d}X_{0.02+d}Te$ ($-0.001<d<0.001$).

In still other embodiments, the dopant is sodium (Na), and a precipitated phase of the precipitate containing sodium may be at least one of NaTe and $Na_2Te$.

In still other embodiments of the present invention, thermoelectric generators include the above-described Pb—Te based thermoelectric material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A, 1B and 1C are is a SEM images showing a grain size of a thermoelectric material according to Examples 1 to 3 of the present invention, in which FIG. 1A is a SEM image of a thermoelectric material according to Example 1, FIG. 1B is a SEM image of a thermoelectric material according to Example 2, and FIG. 1C is a SEM image of a thermoelectric material according to Example 3;

FIGS. 11A, 11B, and 11C are is TEM images for comparing sizes of sodium (Na) precipitates in thermoelectric materials according to Examples 1 to 3 of the present invention, in which FIG. 11A is a TEM image of a thermoelectric material according to Example 1, FIG. 11B is a TEM image of a thermoelectric material according to Example 2, and FIG. 11C is a TEM image of a thermoelectric material according to Example 3;

FIGS. 13A, 13B, and 13C are graphs is a graph showing a size of precipitated sodium (Na) according to Examples 1 to 3, in which FIG. 13A is a graph of Example 1, FIG. 13B is a graph of Example 2, and FIG. 13C is a graph of Example 3.

DETAILED DESCRIPTION OF PREFERRED EMBODIMENTS

Figure 1A:
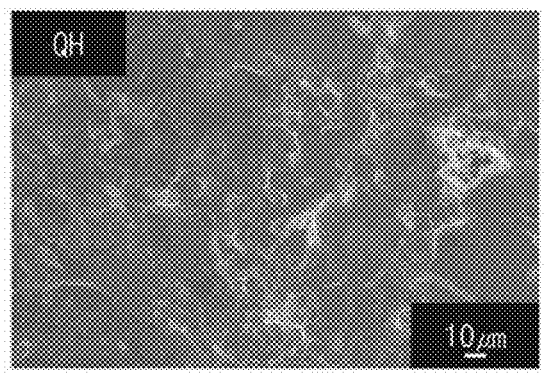
Figure 1B:
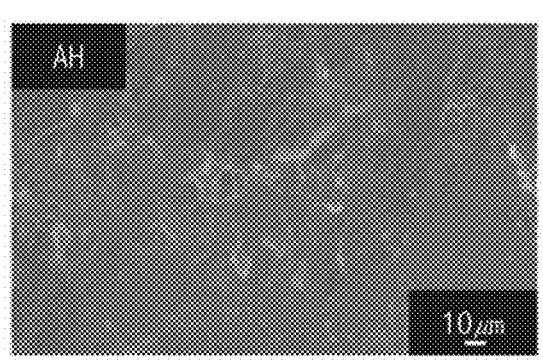

The present invention may be modified in several different forms, and specific embodiments will be exemplified in FIGS and described in detail. It is to be understood that the invention is not limited to the disclosed embodiments, but, on the contrary, is intended to cover various modifications and equivalent arrangements included within the spirit and scope of the disclosure, including the appended claims.

Hereinafter, the present invention will be described with reference to attaching drawings in detail. In the following descriptions, technical configurations or principles well known in this art will be omitted. Although these descriptions are omitted, a skilled person in this art will easy understand characteristic configurations through below descriptions.

The present invention relates to a method of manufacturing a Pb—Te based thermoelectric material by melting, quenching and hot-pressing without an annealing process, and a thermoelectric material prepared by the method.

A composition of a thermoelectric material according to an embodiment of the present invention is $Pb_{0.98-d}Na_{0.02+d}Te$ ($-0.001<d<0.001$). In an embodiment, the thermoelectric material may include a crystal grain having a size of about 3 µm to about 4 µm, and a precipitate having about 2 nm to about 4 nm within the crystal grain. In accordance with an embodiment, sodium (Na) acts as a dopant in the thermoelectric material, and potassium (K) and silver (Ag) other than sodium (Na) may be also used as the dopant. It is concluded through experiments that when sodium (Na) is added within a range of 0.02±0.001 as suggested, a variation of thermoelectric performance index was relatively small and stable. Three methods with which the inventor has experimented will be described as follows.

<Synthesis of Sample>

EXAMPLE 1

Melting, Quenching and Hot-Pressing QH

Samples were manufactured by a method including melting and quenching, followed by hot-pressing. Element lead (Pb, 3N, Alfa Aesar), element tellurium (Te, 4N, Alfa Aesar), and element sodium (Na, 99.95%, Alfa Aesar) were used as starting materials. The weights of these elements were adjusted using a stoichiometric proportion, in which weights of lead (Pb), tellurium (Te), and sodium (Na) were 9.8120 g, 6.1658 g and 0.0222, respectively. A total weight of all particles was 16 g. All raw particles were mixed inside a carbon coated quartz tube in an Ar-filled glove box. The tube was evacuated at a pressure of $10^{-4}$ torr and then sealed. The tube was soaked at a temperature of about 1023 K to about 1123 K for about 1.5 hours to about 2.5 hours, heated to a temperature of about 1223 K to about 1323 K for about 5.5 hours to about 6.5 hours for melting, and then quenched in low-temperature water. As a result, an obtained ingot was pulverized to a powder, and then hot-pressed at a temperature of 500° Celsius and at a pressure of about 90 MPa to about 110 MPa for about 0.8-1.2 hours.

In an embodiment, the soaking was performed before a melting process for a stable reaction of sodium (Na) having a low melting point, so that after sodium (Na) was reacted with other elements, sodium (Na) might participate in a reaction during the melting process.

EXAMPLE 2

Melting, Annealing and Hot-Pressing AH

Samples were manufactured by a method including melting and annealing, followed by hot-pressing. Element lead (Pb, 3N, Alfa Aesar), element tellurium (Te, 4N, Alfa Aesar), and element sodium (Na, 99.95%, Alfa Aesar) were used as starting materials. The weights of these elements were adjusted using a stoichiometric proportion, in which weights of lead (Pb), tellurium (Te), and sodium (Na) were 9.8120 g, 6.1658 g and 0.0222, respectively. A total weight of all particles was 16 g. All raw particles were mixed inside a carbon coated quartz tube in an Ar-filled glove box. The tube was evacuated at a pressure of $10^{-4}$ torr and then sealed. The tube was soaked at temperature of about 1023 K to about 1123 K for about 1.5 hours to about 2.5 hours, heated to temperature of about 1223 K to about 1323 K for about 5.5 hours to about 6.5 hours for melting, and then slowly cooled to a temperature of about 923 K to about 1123 K for about 46 hours to about 50 hours. As a result, an obtained ingot was pulverized to a powder, and then hot-pressed at a temperature of 500° Celsius and at a pressure of about 90 MPa to about 110 MPa for about 0.8 hours to 1.2 hours.

EXAMPLE 3

Melting, Quenching, Annealing and Got Pressing QAH

Samples were manufactured by a method including melting, quenching and annealing, followed by hot-pressing. Element lead (Pb, 3N, Alfa Aesar), element tellurium (Te, 4N, Alfa Aesar), and element sodium (Na, 99.95%, Alfa Aesar) were used as starting materials. The weights of these elements were adjusted using a stoichiometric proportion, in which weights of lead (Pb), tellurium (Te), and sodium (Na) were 9.8120 g, 6.1658 g and 0.0222, respectively. A total weight of all particles was 16 g. All raw particles were mixed inside a carbon coated quartz tube in an Ar-filled glove box. The tube was evacuated at a pressure of $10^{-4}$ torr and then sealed. The tube was soaked at a temperature of about 1023 K to about 1123 K for about 1.5 hours to about 2.5 hours, heated to temperature of about 1223 K to about 1323 K for about 5.5 hours to about 6.5 hours for melting, and then quenched in low-temperature water. Next, the tube was annealed at a temperature of about 923 K to about 1123 K for about 46 hours to about 50 hours. As a result, an obtained ingot was pulverized to a powder, and then hot-pressed at a temperature of 500° Celsius and at a pressure of about 90 MPa to about 110 MPa for about 0.8 hours to about 1.2 hours.

In the above three synthesis methods, after hot-pressing, the total weight of each of the samples was about 4.5 g to about 5.5 g. After hot-pressing, the length of each of the samples was about 0.95 cm to about 1.05 cm, and the width of each of the samples was about 0.95 cm to about 1.05 cm.

The inventor synthesized Na-doped PbTe alloys by the three different methods and measured/compared characteristics of the alloys.

Example 1 is a method including melting, quenching and hot-pressing QH, Example 2 is a method including melting, annealing and hot-pressing AH, and Example 3 is a method including melting, quenching, annealing, and hot-pressing. It was verified that since Example 1 did not go through with the annealing process compared to Example 2 and Example 3, Example 1 had advantages capable of reducing process time and costs, and also represented other advantages.

Figure 1C:
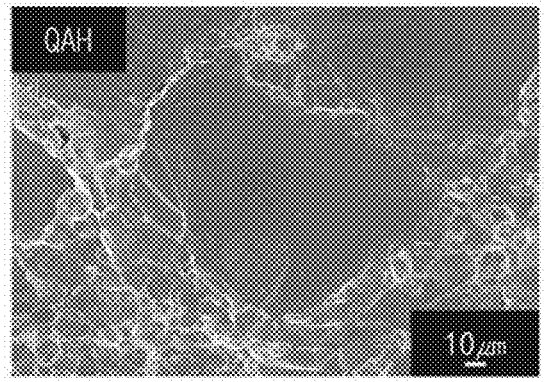
Figure 2A:
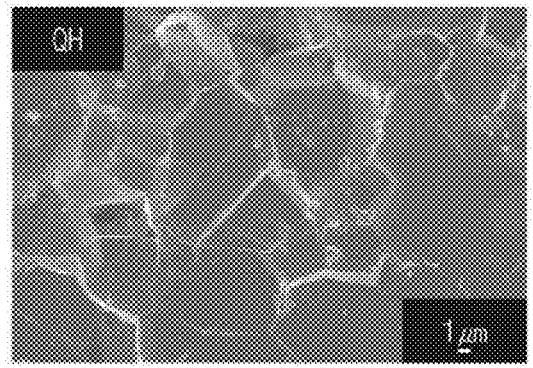
FIGS. 2A, 2B, and 2C are is an enlarged views of FIGS. 1A, 1B, and 1C, respectively.
Figure 2B:
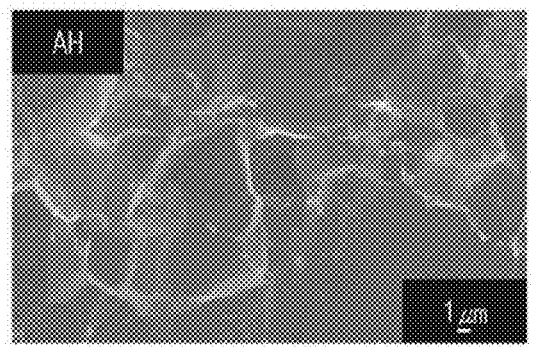
Figure 2C:
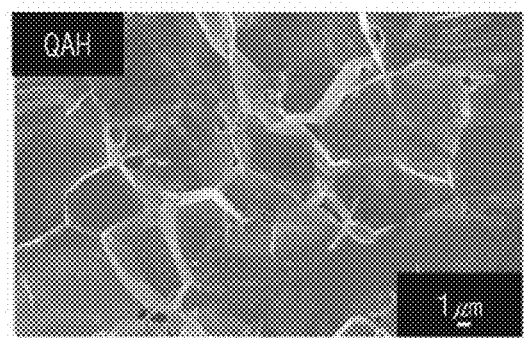

FIGS. 1A to 1C and FIGS. 2A to 2C are SEM images showing a crystal grain size of each of thermoelectric materials according to each of the Examples. Referring to FIGS. 1A to 1C and FIGS. 2A to 2C, it can be seen that a crystal grain size of Example 1 (FIGS. 1A and 2A) is smaller than that of each of Example 2 (FIGS. 1B and 2B) and Example 3 (FIGS. 1C and 2C). Average grain sizes of Example 1, Example 2, and Example 3 are about 3.7 um, 100 um, and 8 um, respectively. A small grain size contributes to effective scattering of phonon and generates small lattice thermal conductivity. FIGS. 1A to 1C and FIGS. 2A to 2C were obtained by a JSM-6701F SEM.

Figure 3:
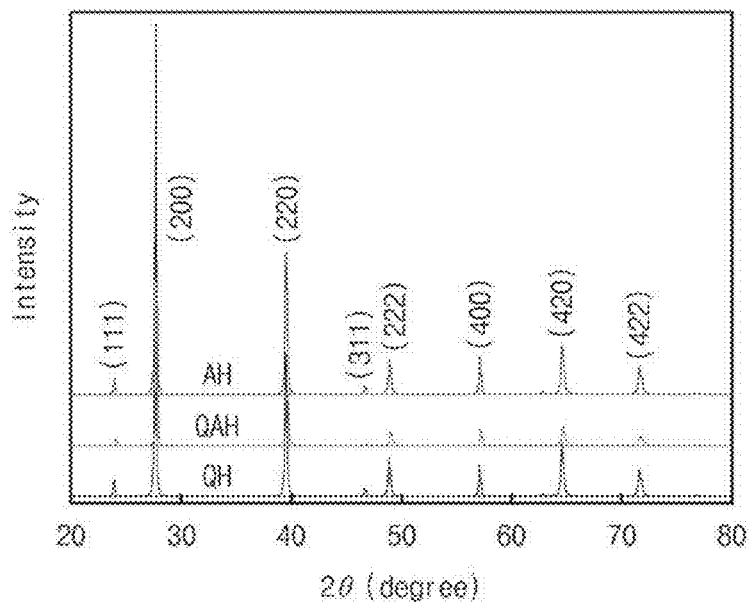
FIG. 3 is a view showing an XRD pattern of a thermoelectric material according to Examples 1 to 3 of the present invention.

FIG. 3 is a view illustrating an XRD pattern at room temperature according to Examples 1 to 3. A crystal structure of each of Examples was measured with a powder x-ray diffraction (XRD) by Cu-Ka radiation using Rigaku powder x-ray diffractometer at room temperature. Referring FIG. 3, it is seen that Pb—Te thermoelectric material according to Examples 1 to 3 includes lead (Pb) and tellurium (Te).

Figure 4:
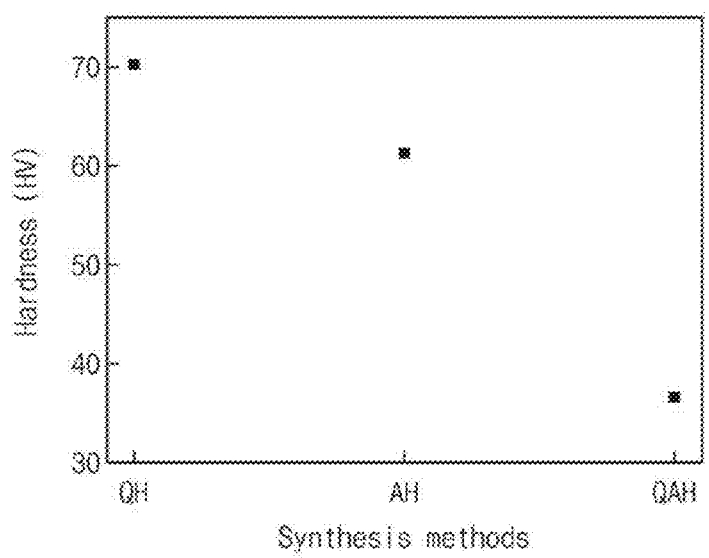
FIG. 4 is showing a characteristic of Vickers hardness of a thermoelectric material according to Examples 1 to 3 of the present invention.
Figure 5:
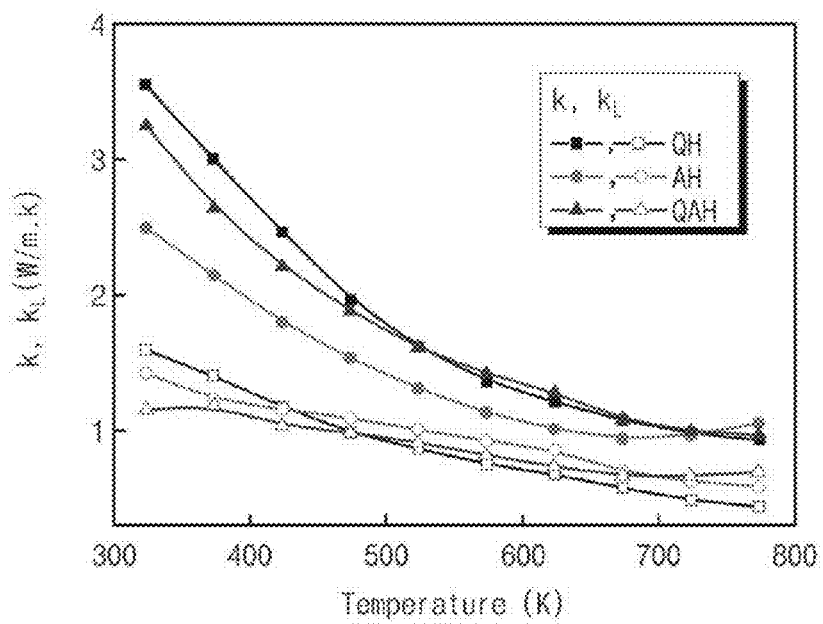
FIG. 5 is a graph showing temperature dependences of heat conductivity and lattice heat conductivity of a thermoelectric material according to Examples 1 to 3 of the present invention.
Figure 6:
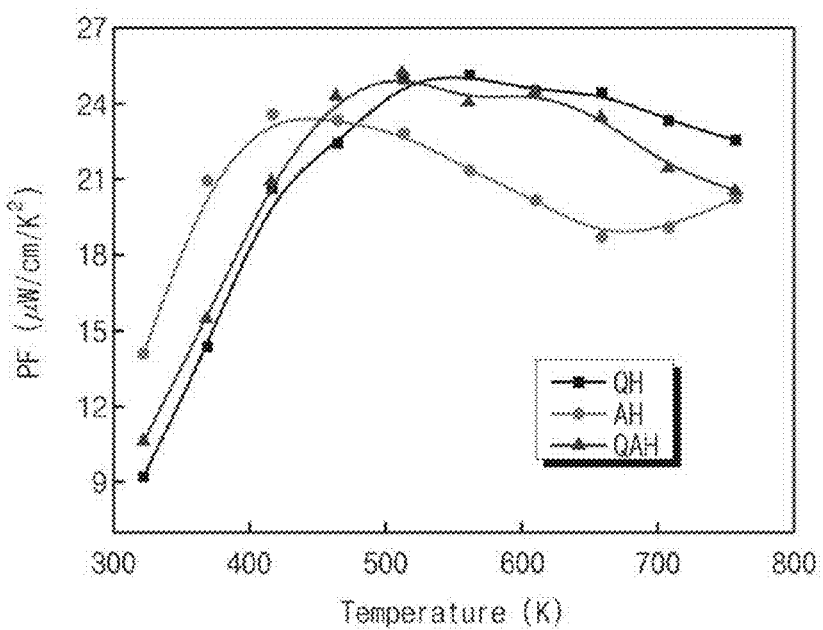
FIG. 6 is a graph showing a temperature dependence of a power factor of a thermoelectric material according to Examples 1 to 3 of the present invention.
Figure 7:
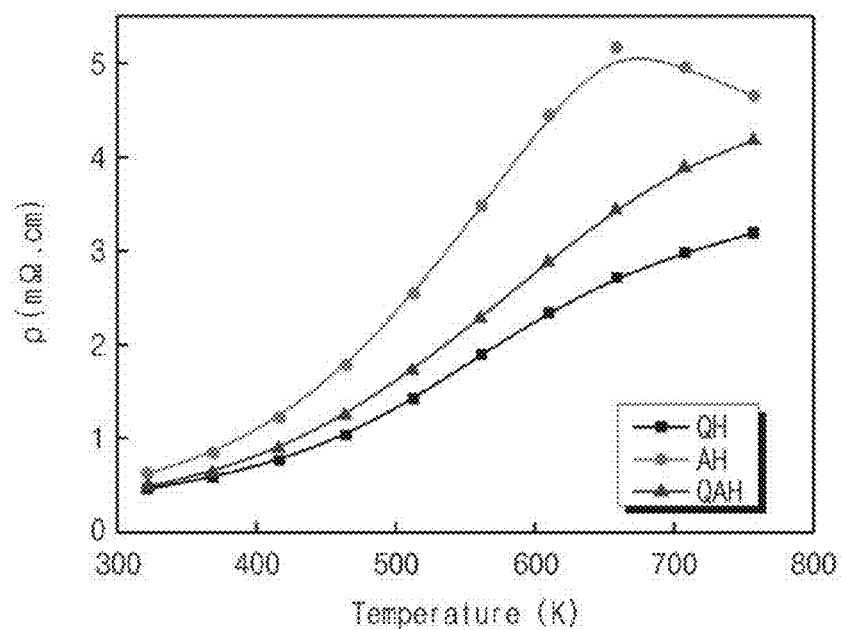
FIG. 7 is a graph showing a temperature dependence of an electric resistance of a thermoelectric material according to Examples 1 to 3 of the present invention.
Figure 8:
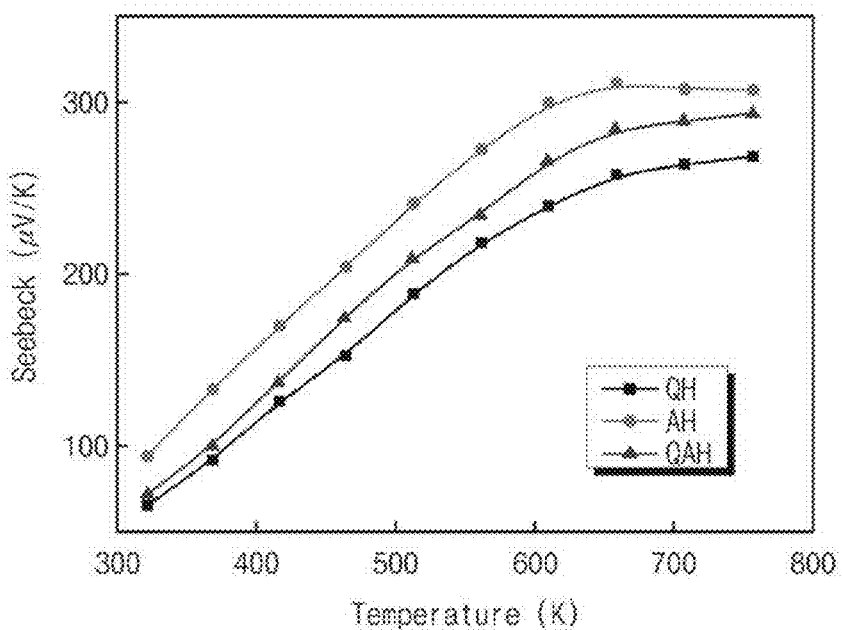
FIG. 8 is a graph showing a temperature dependence of a Seebeck coefficient of a thermoelectric material according to Examples 1 to 3 of the present invention.

FIG. 4 is a view representing a characteristic of hardness, and the hardness was measured using Vickers Hardness Tester. Referring to FIG. 4, it is seen that hardness of Example 1 is larger than that of each of Example 2 and Example 3.

Figure 9:
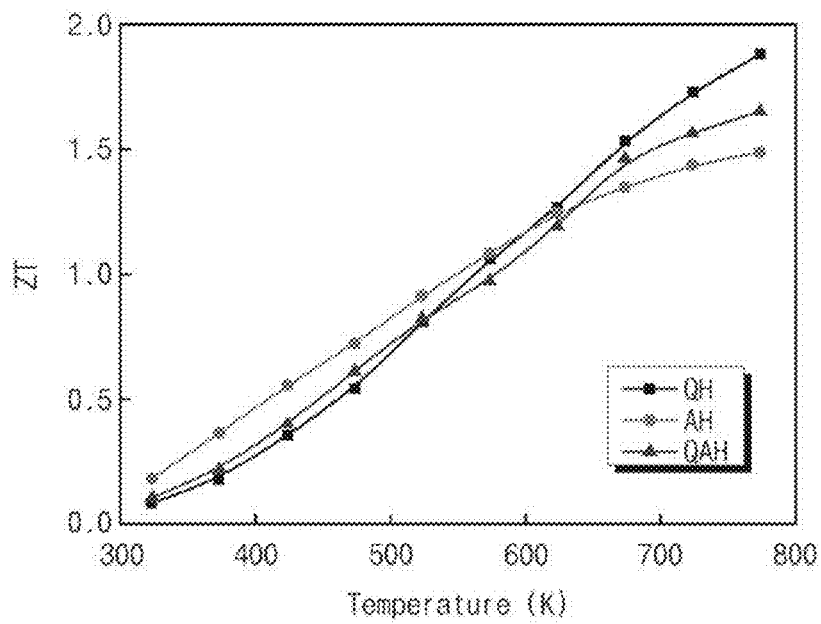
FIG. 9 is a graph showing a temperature dependence of a performance index ZT of a thermoelectric material according to Examples 1 to 3 of the present invention.

FIGS. 5 to 9 are graphs for comparison of temperature dependences of thermal conductivities (k) and lattice thermal conductivities ($k_L$)(FIG. 5), temperature dependences of power factors (FIG. 6), temperature dependences of electrical resistances (FIG. 7), temperature dependences of Seebeck coefficients (FIG. 8), and temperature dependences of performance indexes ZT (FIG. 9) of the Examples. The electric resistance and the Seebeck coefficient were concurrently measured using an ULVAC ZEM-3 in a helium atmosphere. Referring to FIG. 9, it is seen that in a result of calculating the performance index using results shown in FIGS. 5 to 8, Example 1 has a higher performance index compared to Example 2 and Example 3 in a middle temperature region of about 700 K to about 800 K.

Figure 10:
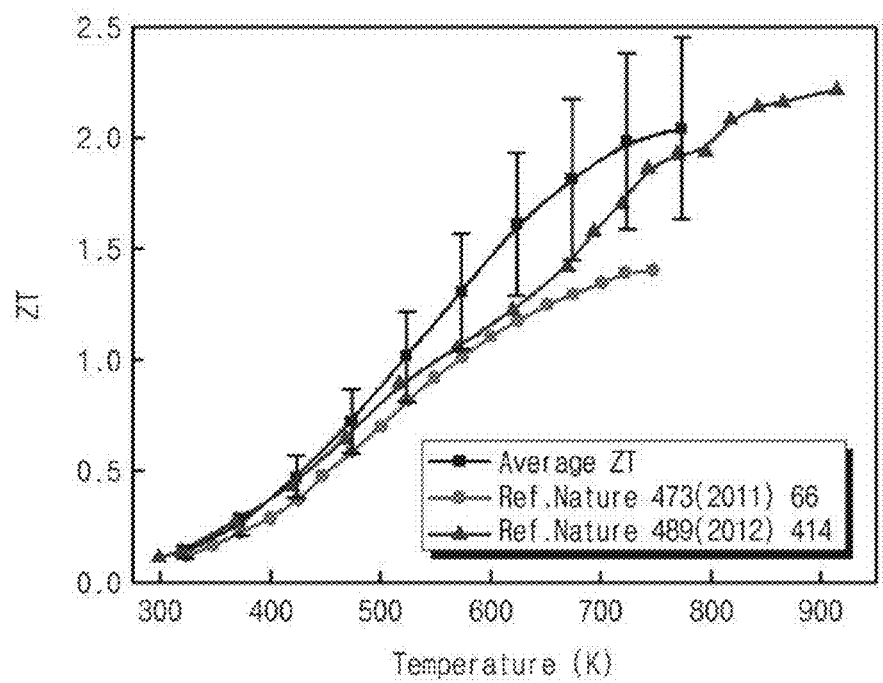
FIG. 10 is a graph for comparison of an average performance index of repeated embodiment 1, the highest performance index of a reported NA doped PbTe (Nature 473 (2011)66) and the highest performance of a reported bulk thermoelectric material (Nature 489(2012)414)

FIG. 10 is a view of comparing an average performance index of a repeated Example 1, the highest performance index of a reported Na doped PbTe (Nature 473(2011)66) and the highest performance index of a reported bulk thermoelectric material (Nature 489(2012)414). Referring to FIG. 10, it is seen that the thermoelectric material of Example 1 has a higher performance index than other reported data.

Figure 11A:
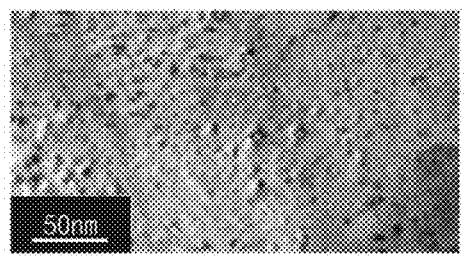
Figure 11B:
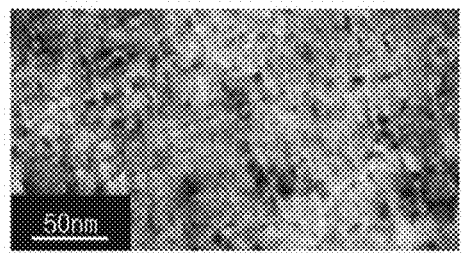
Figure 11C:
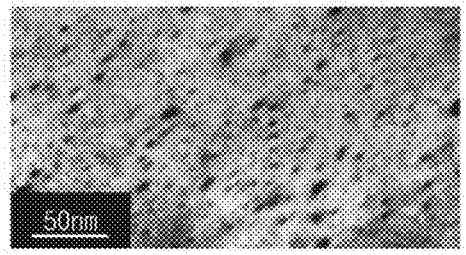
Figure 12A:
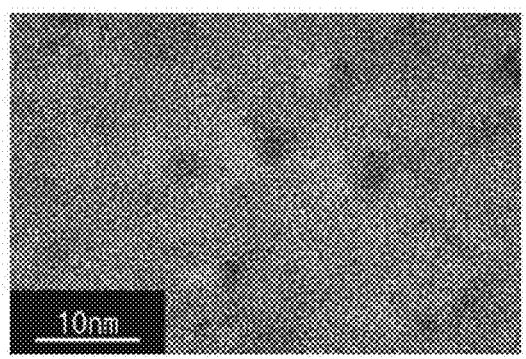
FIGS. 12A, 12B, and 12C are is an enlarged views of FIGS. 11A, 11B, and 11C, respectively.
Figure 12B:
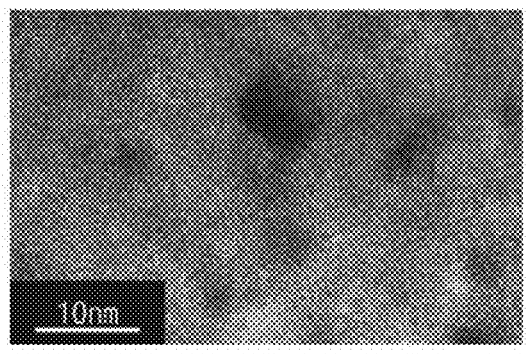
Figure 12C:
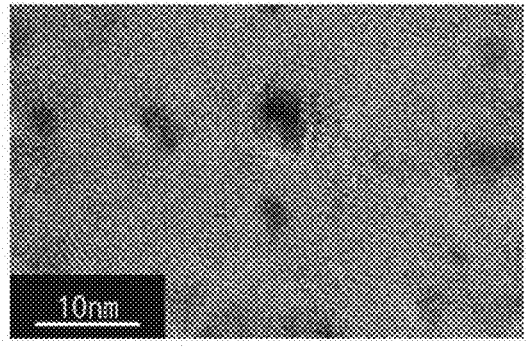

FIGS. 11A to 11C and FIGS. 12A to 12C are TEM images showing sizes of precipitated sodium in thermoelectric materials according to each of the Examples. Referring to FIGS. 11A to 11C and FIGS. 12A to 12C, it is seen that a size of precipitated sodium of Example 1 (FIGS. 11A and 12A) is smaller than that in each of Example 2 (FIGS. 11B and 12B) and Example 3 (FIGS. 11C and 12C).

Figure 13A:
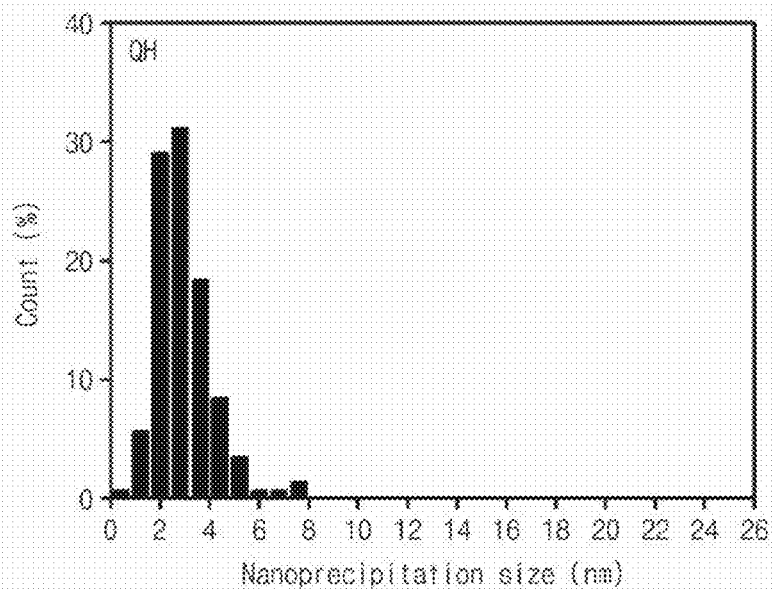
Figure 13B:
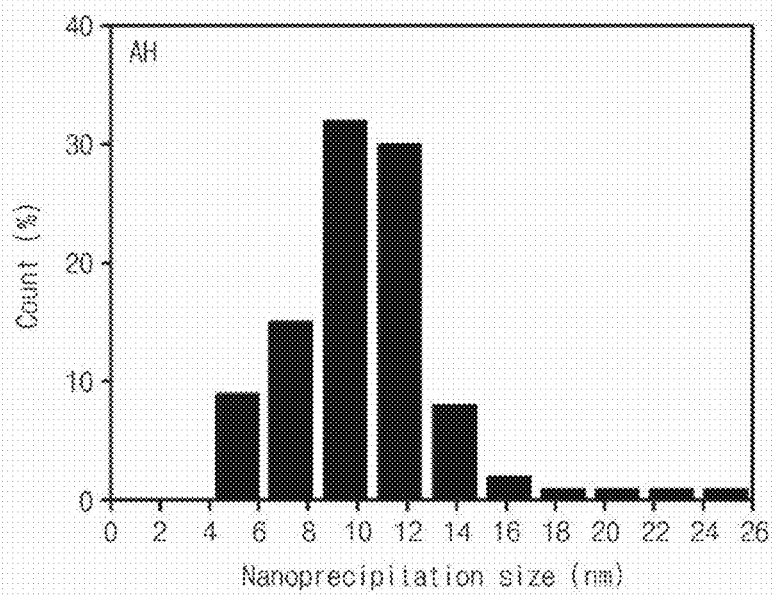

FIG. 13 is a graph showing a size of precipitated sodium according to each of Examples. Referring to FIG. 13, the size of precipitated sodium according to Example 1 (FIG. 13A) is about 2 nm to about 4 nm and has the smallest precipitated phase size. The precipitated phase size relates to thermal conductivity, and the smaller the precipitated phase, the less the thermal conductivity is, so that a high thermoelectric performance index may be obtained. Therefore, Example 1 having a small precipitated phase size may have a higher thermoelectric performance index than Example 2 and Example 3.

Therefore, the highest performance index was obtained by Example 1 among the Examples 1 to 3 of the present invention. An average performance index of Example 1 was not less than about 2.0 at temperature of 773 K, which is the value increased by 46% compared to a performance index ZT=1.4 (Na-doped PbTe alloy) reported so far. Also, in a restricted measuring temperature range, the value is higher than a performance index which is reported to be highest among bulk thermoelectric materials.

As described above, the higher performance index seems to be caused by which since nano particles are distributed in various sizes within a matrix, phonons of various spectrums are scattered, so that lower conductivity is obtained. When described in detail, a thermal conductivity in a solid is mediated by phonon. Phonon is a lattice vibration quantized in a solid. Then, such a movement of phonon is varied according to a micro structure of the solid. When there is a nano-sized precipitate of which grain size is small than or composition is different within grain, the movement of phonon is disrupted, so that thermal conductivity is reduced. In accordance with the present invention, unlike the existing methods, the thermoelectric material is manufactured according to a method including melting, quenching, and hot-pressing. In such a manufacturing process, it is determined that various sizes of grains exist and nano particles are distributed within the grains in the thermoelectric material generated finally, and as a result, thermal conductivity is reduced, and a performance index is improved. For example, there exist small grains having a size of 100 nm to 10 nm and large grains having a size of tens of microns, and nano particles are distributed in unit of several nm in grains. The stability of such a higher performance index has been verified repeatedly several times. A Vickers Hardness value of Example 1 according to a QH method also exhibited the greatest value among three methods. Therefore, there is drawn a conclusion that the QH method of the present invention is the best method by which a Na-doped PbTe alloy having a higher performance index and a good mechanical property is synthesized.

Characteristics of the present invention are to obtain a new synthesis technology called a QH method and a $Pb_{0.98}Na_{0.02}Te$ alloy having a performance index of 2.0 or more. The QH method has main advantages, such as a simple synthesis process, shortening of synthesis time, and mass production Although a Na-doped PbTe alloy has been studied by other researchers, a high performance index and/or a structure like the above described structure has not yet been reported, and in the thermoelectric material, the synthesis technology including melting, quenching, and hot-pressing proposed in the present invention is a novel method that has not yet been used.

In accordance to embodiments of the present invention, a Pb—Te based thermoelectric material is manufactured through a novel and simple method including melting/quenching/hot-pressing without an annealing process, thereby remarkably reducing process time and costs, and remarkably improving a performance index compare to the existing methods.

The above-disclosed subject matter is to be considered illustrative, and not restrictive, and the appended claims are intended to cover all such modifications, enhancements, and other embodiments, which fall within the true spirit and scope of the present invention. Accordingly, the embodiments and drawings disclosed in the present disclosure are not intended to limit the technical spirit of the present disclosure, but are illustrative. The scope of the technical spirit of the present disclosure is not limited by the embodiments and drawings, and the scope of the present disclosure should be interpreted based on the following appended claims. Accordingly, all technical spirits falling within an equivalent range should be construed to be included in the scope of the present disclosure.

What is claimed is:

1. A method of manufacturing a Pb-Te based thermoelectric material, the method comprising:
    forming a Pb—Te based mixture by mixing element lead, element tellurium and a dopant;
    performing a soaking process to the mixture;
    melting and then quenching the mixture;
    obtaining an ingot after the quenching; and
    obtaining a thermoelectric sintered body by pulverizing the ingot in the form of a powder and hot-pressing the pulverized powder in a middle temperature range from about 700 K to about 800 K,
    wherein the soaking process comprises heat treatment, the heat treatment being performed at about 1023 K to about 1123 K for about 1.5 hours to about 2.5 hours, such that the dopant is reacted with at least one of the element lead or the element tellurium,
    wherein the hot-pressing is performed after the quenching without an annealing process between the quenching and the hot-pressing, and
    wherein the dopant is at least one of sodium (Na), potassium (K), and silver (Ag).

2. The method of claim 1, wherein the forming of the mixture, comprises mixing element lead, element tellurium and the dopant so that a composition ratio of the dopant is 2 atom %.

3. The method of claim 2, wherein three quarters of the dopant is precipitated within a crystal grain of the Pb—Te based thermoelectric material.

4. The method of claim 3, wherein the three quarters of the dopant is precipitated in a size of about 2 nm to about 4 nm within the crystal grain of the Pb—Te based thermoelectric material.

5. The method of claim 1, wherein the thermoelectric sintered body has a thermoelectric performance index of at least 2.0 in the middle temperature region from about 700 K to about 800 K.

6. The method of claim 1, wherein the dopant comprises sodium (Na), and the obtaining of the thermoelectric sintered body comprises precipitating the sodium.

7. The method of claim 6, wherein the sodium in the precipitating of sodium (Na) is precipitated in at least one selected from NaTe and $Na_2Te$.

8. The method of claim 7, wherein the NaTe and the $Na_2Te$ are precipitated in sizes of about 2 nm to about 4 nm.

9. The method of claim 1, wherein the thermoelectric sintered body comprises a plurality of crystal grains having an average size of about 3 μm to about 4 μm.

10. A Pb—Te thermoelectric material comprising a Pb—X—Te in which a dopant X is doped, the Pb—Te thermoelectric material comprising:
   a plurality of crystal grains; and
   a precipitate precipitated in a size of about 2 nm to about 4 nm within the crystal grains, and containing the dopant therein.

11. The Pb—Te thermoelectric material of claim 10, wherein the dopant is at least one of sodium (Na), potassium (K), and silver (Ag).

12. The Pb—Te thermoelectric material of claim 10, wherein the plurality of crystal grains have an average size of about 3 μm to about 4 μm.

13. The Pb—Te thermoelectric material of claim 10, wherein the Pb—Te based thermoelectric material has a composition of $Pb_{0.98-d}X_{0.02+d}Te$ (−0.001<d<0.001).

14. The Pb—Te thermoelectric material of claim 10, wherein the dopant is sodium (Na). and a precipitated phase of the precipitate containing sodium is at least one of NaTe and $Na_2Te$.

15. A thermoelectric generator comprising the Pb—Te based thermoelectric material of claim 10.

* * * * *